United States Patent [19]

Tullis et al.

[11] Patent Number: 4,923,353
[45] Date of Patent: May 8, 1990

[54] APPARATUS FOR AUTOMATED CASSETTE HANDLING

[75] Inventors: Barclay J. Tullis, Palo Alto; John S. Bailey, Sunnyvale; D. R. Gunawardena, Union City; Ulrich Kaempf, Los Altos, all of Calif.

[73] Assignee: Hewlett-Packard Company, Palo Alto, Calif.

[21] Appl. No.: 72,181

[22] Filed: Jul. 9, 1987

Related U.S. Application Data

[62] Division of Ser. No. 759,013, Jul. 24, 1985, Pat. No. 4,705,444.

[51] Int. Cl.5 .............................................. B65G 65/02
[52] U.S. Cl. .................................................. 414/226
[58] Field of Search ............... 414/217, 222, 615, 225, 414/226, 729, 730, 733, 917, 332, 609, 610, 612, 626, 621, 622, 586, 785; 118/500, 503, 730, 729; 432/239

[56] References Cited

U.S. PATENT DOCUMENTS

| | | | |
|---|---|---|---|
| 3,052,366 | 9/1962 | Duncan | 414/733 |
| 3,651,957 | 3/1972 | Ball et al. | 414/226 |
| 4,047,624 | 9/1977 | Dorenbos | 414/217 |
| 4,343,584 | 8/1982 | Hudgins | 414/226 X |
| 4,345,866 | 8/1982 | Greene | 414/225 X |
| 4,500,407 | 2/1985 | Boys et al. | 414/217 X |
| 4,532,970 | 8/1985 | Tullis et al. | 220/20.5 X |
| 4,558,984 | 12/1985 | Garrett | 414/217 X |
| 4,668,484 | 5/1987 | Elliott | 312/31.1 X |
| 4,674,939 | 6/1987 | Maney et al. | 414/292 |
| 4,815,912 | 3/1989 | Maney et al. | 414/217 |

FOREIGN PATENT DOCUMENTS

| | | | |
|---|---|---|---|
| 2702974 | 7/1978 | Fed. Rep. of Germany | 414/733 |
| 2512425 | 9/1981 | France . | |
| 710309 | 6/1954 | United Kingdom | 414/622 |

*Primary Examiner*—Frank E. Werner

[57] ABSTRACT

An automated cassette handler transports a cassette containing integrated circuit wafers between first and second elevators in a standardized mechanical interface (SMIF) system for integrated circuit processing. The handler is adapted to grip and transport the cassette while positively pushing the wafers into the cassette.

5 Claims, 10 Drawing Sheets

APPARATUS FOR AUTOMATED CASSETTE HANDLING

This is a division of application Ser. No. 759,013, filed July 24, 1985, now U.S. Pat. No. 4,705,444.

BACKGROUND OF THE INVENTION

As described by Tullis et al. in "Particle-Free Dockable Interface for Integrated Circuit Processing", U.S. patent application Ser. No. 536,600 filed Sept. 28, 1983, now Pat. No. 4,532,970, and by Thrasher et al. in "Standardized Mechanical Interface System for Integrated Circuit Processing", U.S. patent application Ser. No. 536.599 filed Sept. 28, 1983, abandoned and by Tullis in "Interlocking Door Latch for Dockable Interface for Integrated Circuit Processing", U.S. patent application Ser. No. 594,498 filed Mar. 29, 1984, now Pat. No. 4,534,389, a standardized mechanical interface (SMIF) system has been demonstrated for the fabrication of integrated circuits (ICs). The SMIF system reduces particle contamination during storage, transport and transfer in IC fabrication by mechanically minimizing the volume of gaseous media surrounding IC wafers during fabrication, insuring that much of this gas is essentially stationary relative to the wafers, and insuring that particles from exterior "ambient" environments cannot enter the wafer environment. Experiments have shown that the SMIF system of wafer handling reduces wafer particle contamination by as much as ten times when compared to conventional Class 100 clean room wafer handling practice.

Figure 1:
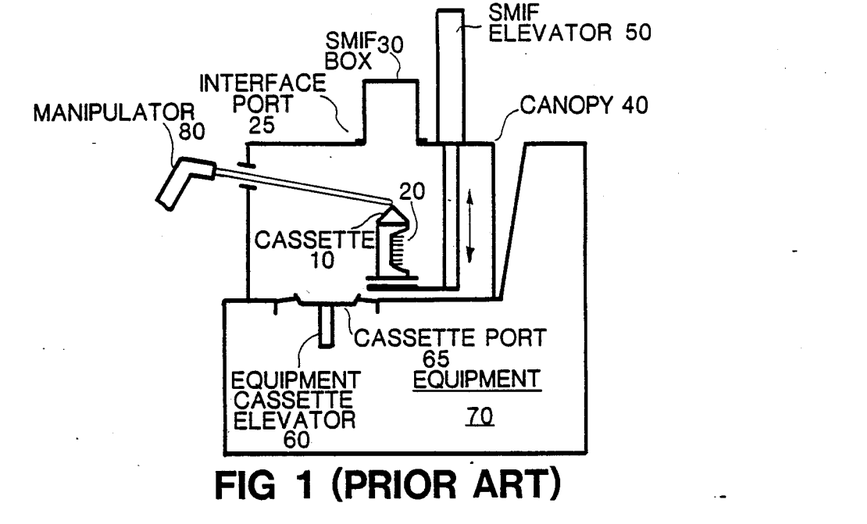
FIGS. 1 and 2 show SMIF system implementations according to the prior art.

Typically in the SMIF system, as shown in FIG. 1, a cassette 10 holding wafers 20 in cassette slots (not shown) is transferred through an interface port between a SMIF box 30 and a SMIF environment under a canopy 40 by means of a SMIF elevator 50. Once inside the canopy 40, the cassette 10 is transferred to an equipment cassette elevator 60 which is part of a piece of processing equipment 70 in which the wafers 20 are to be processed. After processing, the wafers 20 are transferred back into the cassette 10 and the cassette 10 is transferred from the equipment elevator 60 of the processing equipment 70 to the SMIF elevator 50 which in turn transfers the cassette 10 back into the SMIF box 30. In some processing equipment 70, wafer handlers (not shown) place the processed wafers 20 in the cassette 10 with the wafers 20 protruding some distance out of the cassette slots. In other cases wafers 20 can slide on the cassette slots due to vibration or jerky motions of the processing equipment 70. In either case it is important to push the wafers 20 all the way into the cassette 10 before the SMIF elevator 50 is raised to transfer the cassette 10 into the SMIF box 30.

Figure 2:
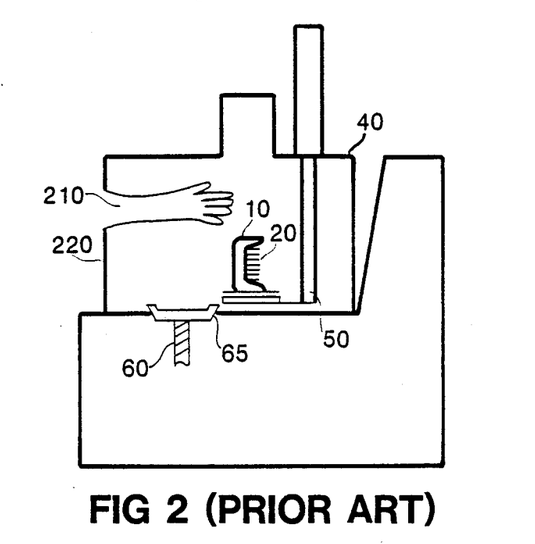

Formerly there have been two ways of transferring cassettes between SMIF elevators and equipment elevators while making sure that the wafers are pushed fully into the cassette. As shown in FIG. 1, a cassette manipulator 80 can be manually manipulated by an operator from outside of the SMIF canopy 40. Such a manipulator 80 is advantageous in that its motion within the canopy 40 does not cause undesired particle stirring and contamination of the wafers 20. Unfortunately, such a manipulator 80 requires a high degree of manual dexterity to place the cassette 10 in the desired location. A second approach, as shown in FIG. 2, is the use of a sealed glove 210 as in a conventional glove box attached to one wall 220 of the SMIF canopy 40 in order to transfer cassettes 10 between the SMIF elevator 50 and the equipment elevator 60. The glove box solution requires only a moderate degree of manual dexterity to transfer cassettes between the SMIF elevator 50 and the equipment elevator 60 while ensuring that all of the wafers 20 are pushed fully into the cassette 10. However, the glove box solution is strictly manual and the motion of the glove 210 can cause undesirable particle stirring within the SMIF canopy 40.

SUMMARY OF THE INVENTION

The present invention comprises an automated cassette handler which obviates the need for operator dexterity previously required to handle cassettes within a SMIF canopy while minimizing particle stirring within the SMIF canopy. In addition, a controller and associated sensors control the automated cassette handler so that once a SMIF box is placed on the interface port of the canopy, transfer of the cassette between the SMIF box and the equipment elevator can be initiated with the operation of a single switch.

The automated cassette handler transfers cassettes from a SMIF elevator to an equipment elevator and vice versa using a rotational swing motion while maintaining the cassette vertical throughout its travel. The use of rotational elements to move the cassette within the SMIF canopy is important in order to avoid the generation of particles as would occur through use of linear friction elements.

Rotational swing motion of the cassette is accomplished using two pivoted arms. The top ends of the pivoted arms hold into a gripper/wafer depressor mechanism to hold the cassette and both push and retain the wafers fully within the cassette slots, while the bottom ends of the arms are connected to two mutually parallel shafts that are coupled such that the two arms rotate in unison. A motor exterior to the canopy drives the two arms within the canopy, while position sensors detect the location of the swinging arms at the ends of their travel. Typically, the operator places a SMIF box loaded with a cassette of wafers on the interface port of the canopy and actuates a switch. The controller for the cassette handler then initiates a sequence of actions to transfer the cassette from the SMIF box to the equipment elevator. Once the wafers are processed within the process equipment, a reverse sequence of actions is initiated by actuation of the switch so that the cassette is automatically transferred from the equipment elevator back into the SMIF box by the cassette handler. Alternatively, since some process equipment can place the processed wafers in a second cassette or place the processed wafers in the first cassette on a second second equipment elevator, a second cassette handler can also be used to transfer the cassette with the processed wafers into a SMIF box.

DESCRIPTION OF THE PREFERRED EMBODIMENT

As shown in FIGS. 3A through 3D, the cassette handler 300 comprises two main components: a cassette gripper 310 and a wafer depressor 320. The cassette gripper 310 is used to positively grasp a cassette 330 and by means of two arms 340 lift the cassette 330 off of guides 335 on an elevator 50 and place the cassette 330 on guides 336 on elevator 60. Guides 335 and 336 therefore serve to locate cassette 330 on elevators 50 and 60, respectively, via cassette guide bar 337 as the cassette 330 is moved to the ends of rotational arcs 338 and 339. The wafer depressor 320 is used to push wafers 20 into the cassette 330 and to prevent the wafers 20 from falling out of the cassette 330 during transport of the cassette 330.

Figure 3A:
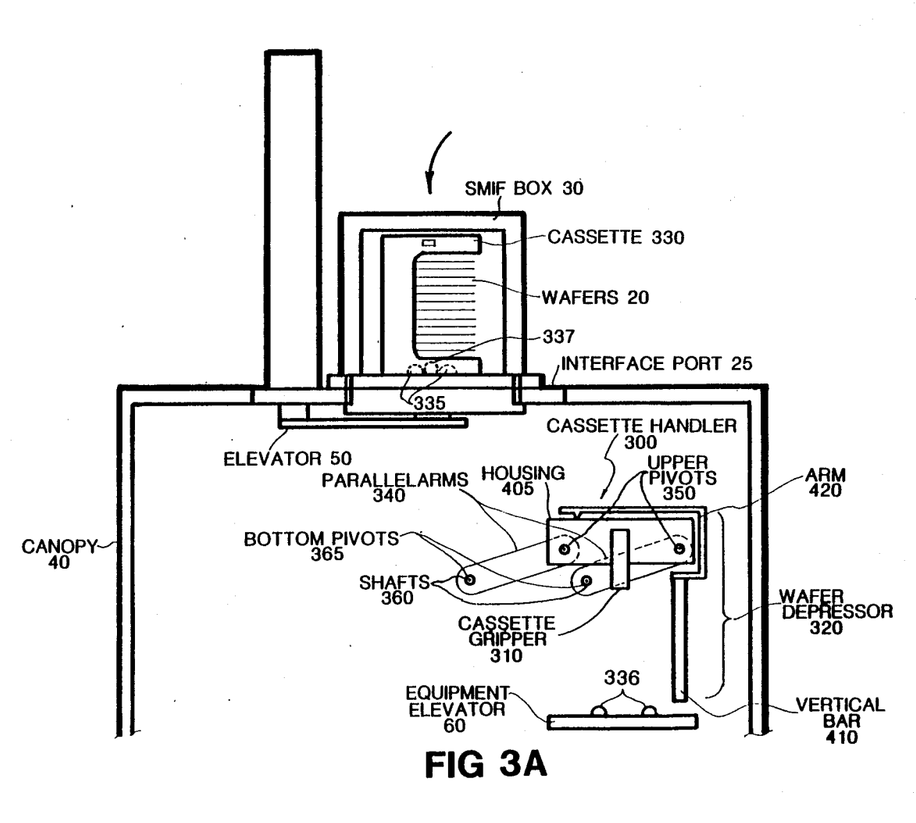
FIGS. 3A-3D show a cassette gripper and wafer depressor according to the present invention and a sequence of steps for their use.
Figure 3B:
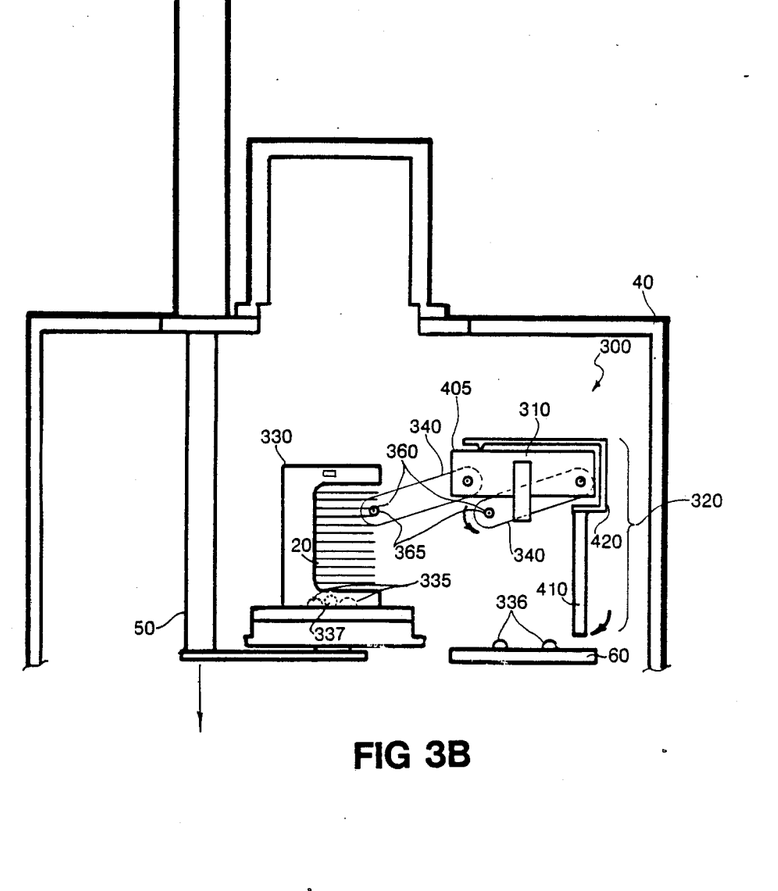
Figure 3C:
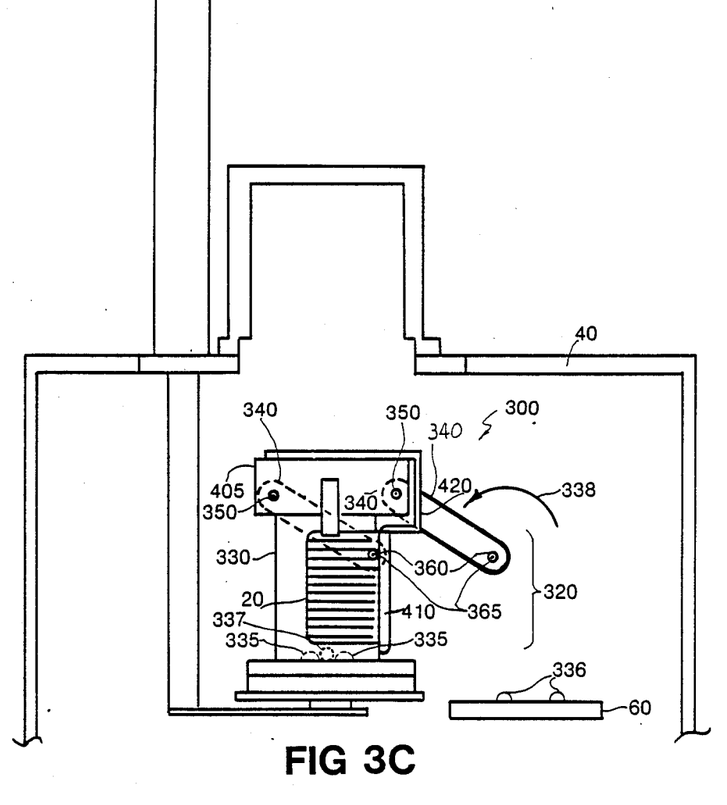
Figure 3D:
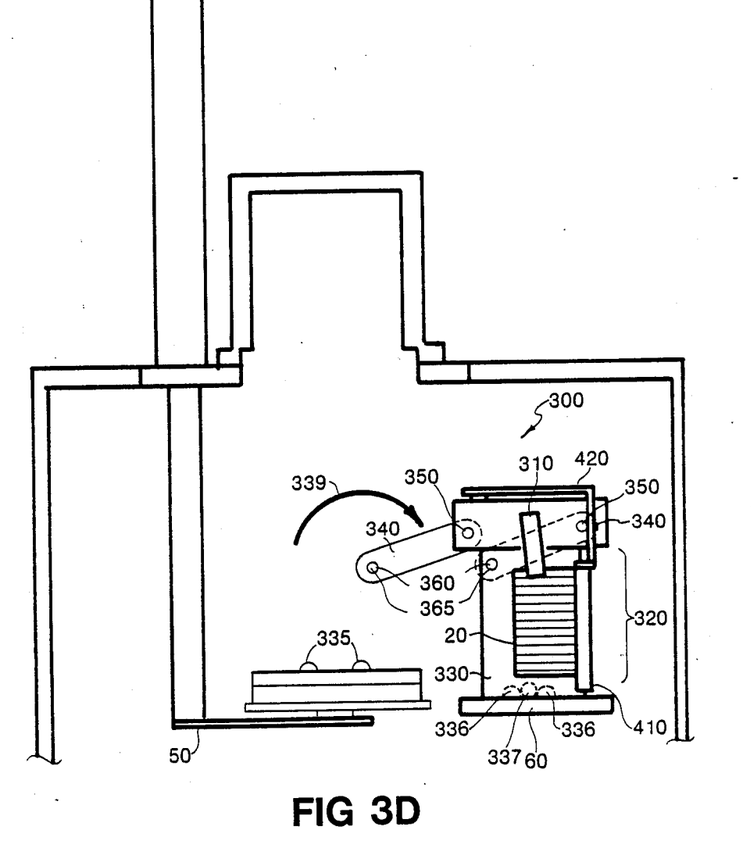
Figure 4:
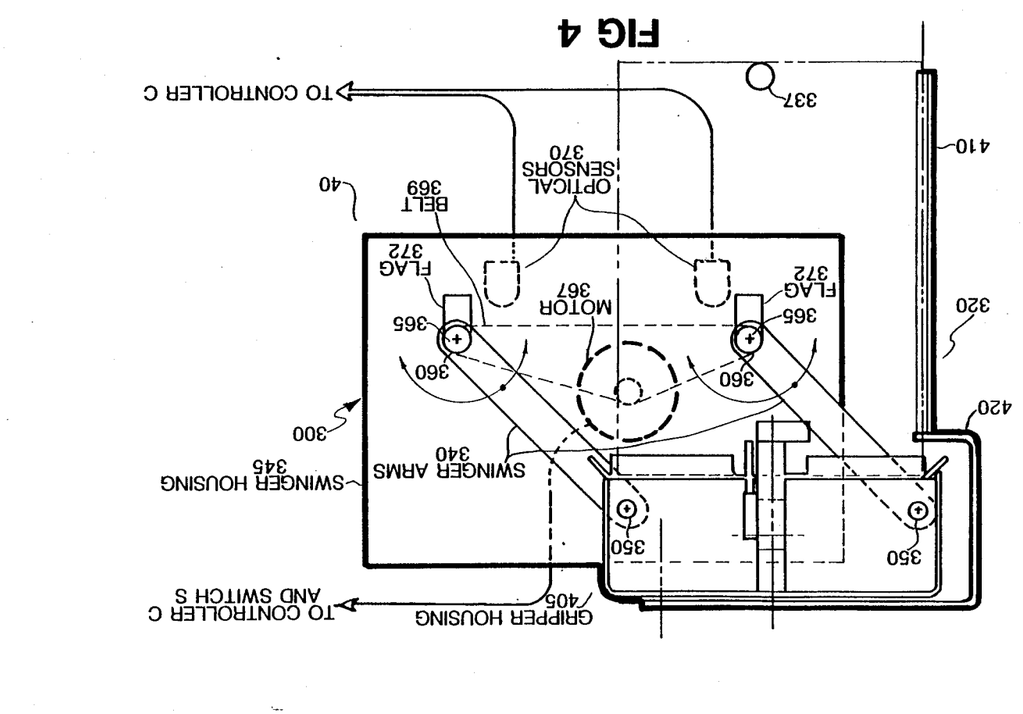
FIG. 4 shows a side view of the mechanism as shown in FIGS. 3A-3D.

The lifting and transporting motion of the cassette handler 300 as shown in the sequence of FIGS. 3C–3D is accomplished using the two parallel arms 340 which couple the cassette gripper housing 405 to the canopy 40. As shown in FIG. 4, the upper ends of arms 340 are attached to the gripper housing 405 by upper pivots 350. The bottom ends of arms 340 are attached by two mutually parallel shafts 360 and two bottom pivots 365 to swinger housing 345 which is an easily removable part of the canopy 40 so that the entire assembly 300 can be easily installed in canopy 40 as a module. The two arms 340 therefore are made to rotate in unison. A motor 367, which is typically mounted outside of canopy 40, drives shafts 360 by a drive linkage such as timing belt 369. Flags 372 are coupled to shafts 360 so that optical sensors 370 can be used to detect whether the arms 340 are at either extremity of their travel.

Figure 5:
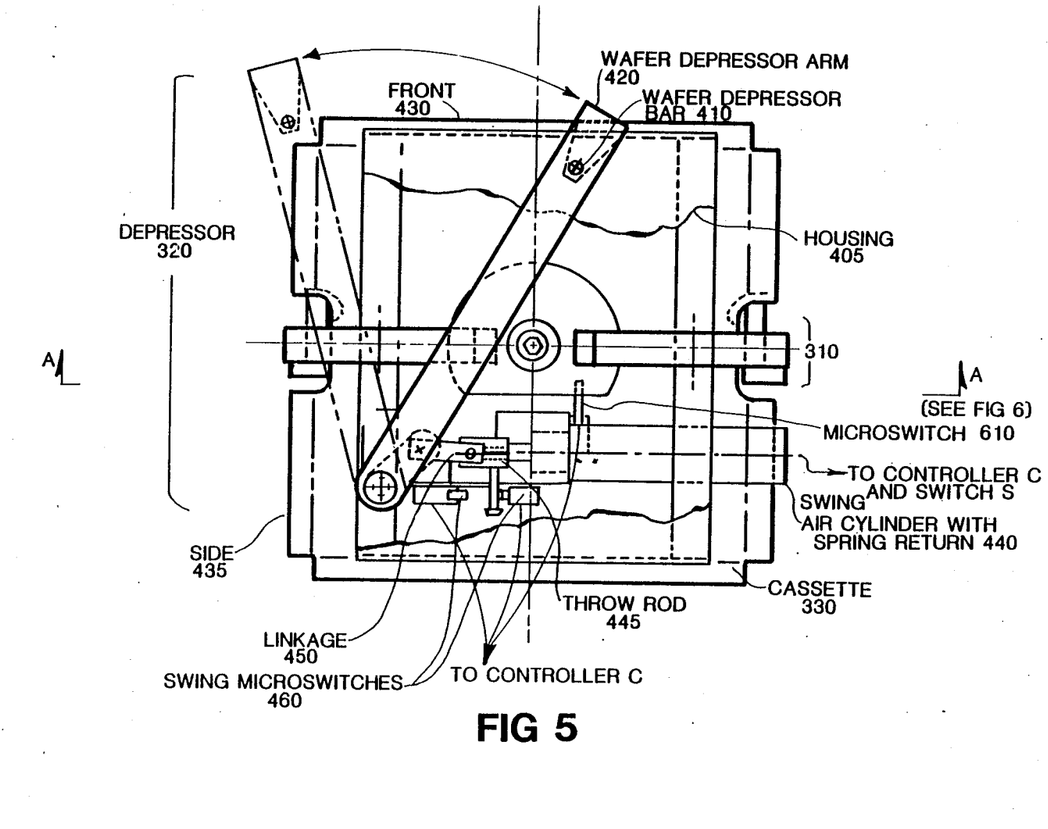
FIG. 5 shows a top view of the mechanism as shown in FIGS. 3A-3D.

As shown in FIGS. 3A–3D, and in detail in FIGS. 4 and 5, the wafer depressor 320 that pushes the wafers 20 into the cassette 330 is comprised of a vertical bar 410 which can rotate about its own axis, connected by a depressor arm 20 to the housing 405 so that the bar 410 can be swung around from the front 430 to the side 435 of the cassette 330 as shown in FIG. 5. Typically, a swing air cylinder 440 with spring return is coupled to arm 420 by air cylinder throw rod 445 and linkage 450 to swing the bar 410. A spring return is used to retract the air cylinder throw rod 445 to prevent blowing particles or lubricant into the canopy 40 through leaks in the rod seal of air cylinder 440. When the cassette 330 is gripped, the air cylinder 440 is simultaneously actuated to swing bar 410 across the front 430 of the cassette 330 and push the wafers 20 into the cassette 330. As long as the cassette 330 is gripped, the bar 410 remains in the front 430 of the cassette 330, thus preventing the wafers 20 from sliding out as, for example shown in the sequence of FIGS. 3C–3D, when the cassette 330 is moved from a SMIF elevator 50 to an equipment elevator 60. In addition, if there is a power failure during operation of the depressor 320, the spring return within cylinder 440 will insure that the bar 410 is maintained in front 430 of the cassette 330 so that the wafers 20 are retained within the cassette 330. When the grip on the cassette 330 is released, the bar 410 is swung to the side 435 to permit the wafers 20 to be removed from the cassette 330 freely. Two swing microswitches 460 are used to detect whether the bar 410 is in the front 430 or on the side 435 of the cassette 330.

Figure 6:
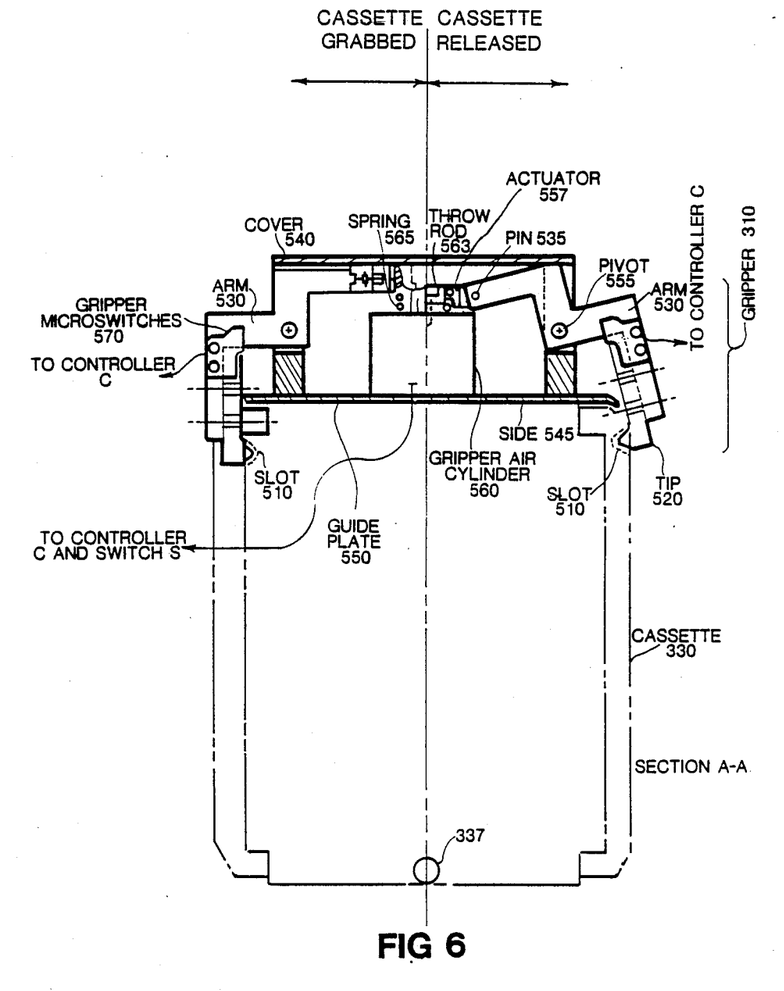
FIG. 6 shows a sectional view of the cassette gripper as indicated in FIG. 5.

The gripper 310 is shown in detailed cross-section in FIG. 6. The cassette 330 is provided, for example, with slots 510 adapted to receive tips 520 which can be changed to fit different styles of cassettes 330. The tips 520 are connected via arms 530 and pins 535 to cover 540. Cover 540, sides 545 and guide plate 550 form housing 405 as shown in FIG. 4. The arms 530 are pivotally coupled to sides 545 via pivots 555. The guide plate 550 serves to locate and center the cassette 330. The tips 520 are engaged via actuator 557, throw rod 563 of gripper cylinder 560 and spring 565, so that as the gripper cylinder 560 extends and retracts the tips 520 engage and disengage slots 510, respectively. As in the case of the swing air cylinder 440, the spring 565 is used to retract the gripper cylinder throw rod 563 to prevent blowing particles or lubricant into the canopy 40 through leaks in the rod seal of cylinder 560. In addition, if there is a power failure during operation of the gripper 310, the spring 565 will insure that the tips 565 are maintained engaged with the cassette 330 so that the cassette 330 will not be dropped. Each arm 530 is also provided with a gripper microswitch 570 to detect whether the cassette 330 is gripped by the gripper 310. An open/close microswitch 610 on housing 405 as shown in FIG. 5 detects whether the gripper 310 is open or closed.

Figure 7:
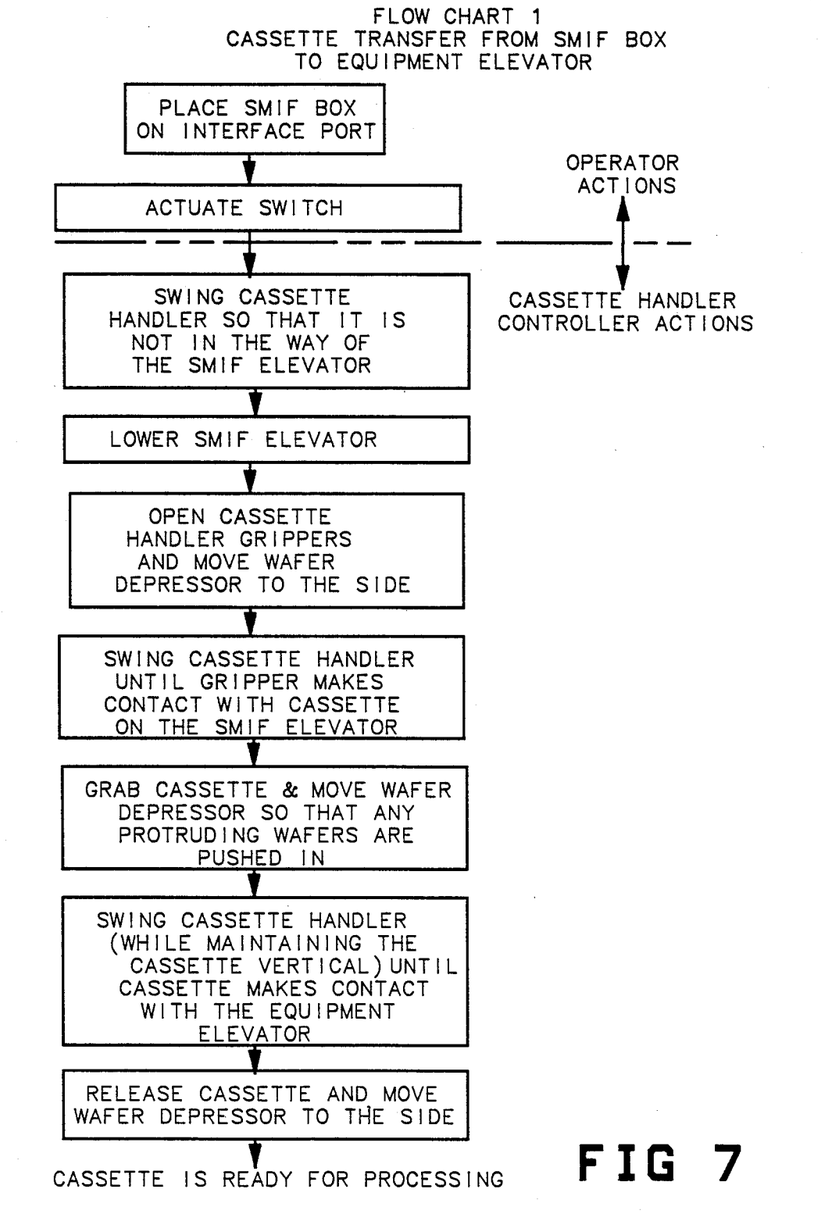
FIGS. 7 and 8 show the sequence of actions to transfer a cassette from a SMIF box to an equipment elevator as shown in FIGS. 3A–3D.
Figure 8:
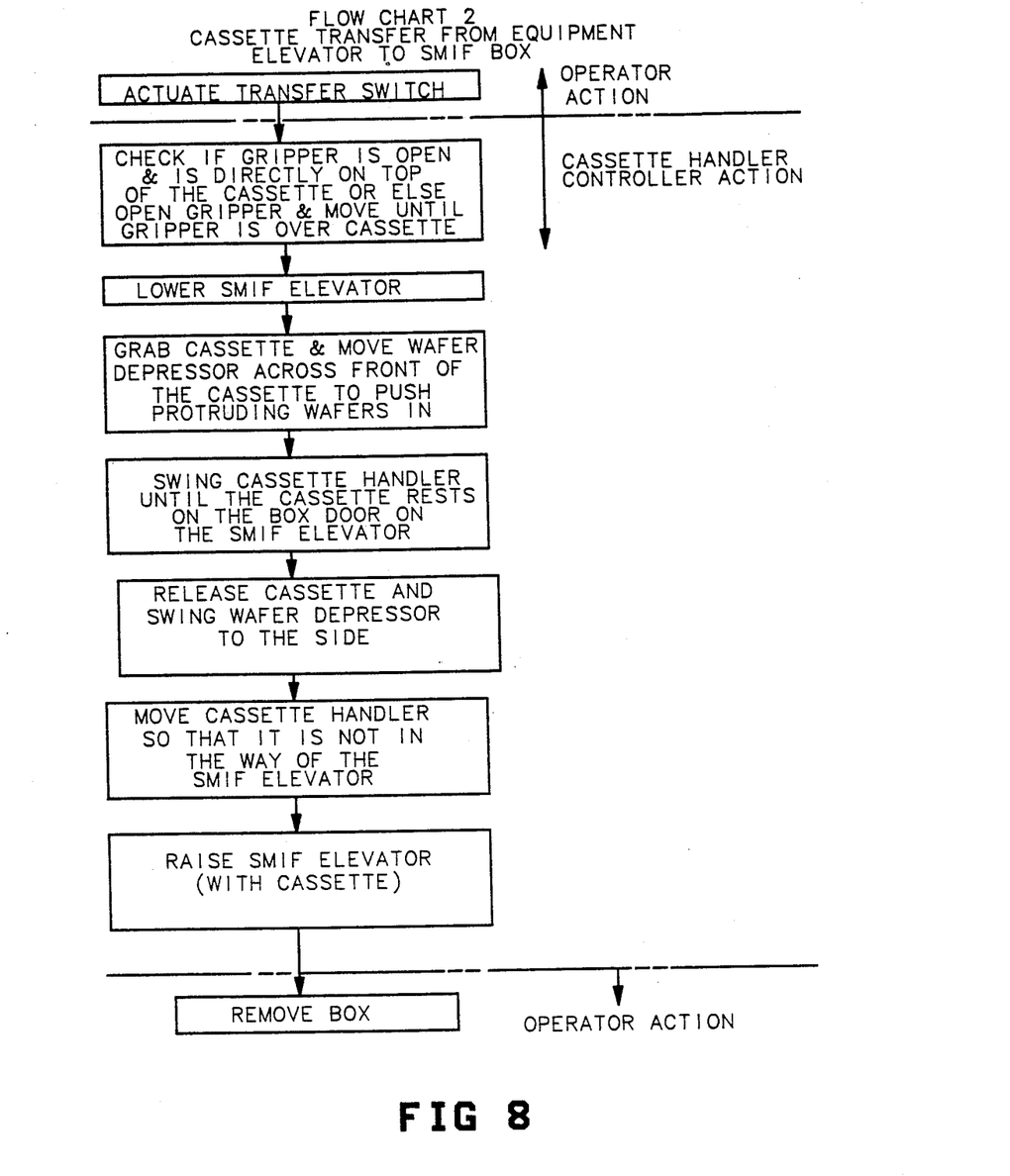

Typically, as shown in FIG. 3A, an operator first places a SMIF box 30 loaded with a cassette 330 of wafers 20 on the interface port 25 of the equipment canopy 40 and actuates a switch S which is electrically connected via a controller C to the air cylinders 440 and 560 as shown in FIGS. 5 and 6. The controller C also receives position information from sensors 370, 460, 610 and 570. The controller C then automatically initiates a sequence of actions as shown in FIGS. 3A–3D and in FIG. 7 to transfer the cassette 330 from the SMIF box 30 to the equipment elevator 60. Once the wafers 20 are processed in the equipment 70 and returned to the cassette 330, the cassette 330 is transferred from the equipment elevator 60 back into the SMIF box 30 using the sequence of actions shown in FIG. 8.

What is claimed is:

1. An automated cassette handler for transporting integrated circuit wafers held in a wafer cassette within a canopy, said canopy coupled to a piece of integrated circuit processing equipment, said handler comprising:
   a swinger housing within the canopy;
   at least two parallel rotation arms coupled between the canopy and the swinger housing so that the swinger housing can be rotationally moved along an arc within the canopy while maintaining the swinger housing in a substantially constant plane with respect to the canopy;
   driver means coupled by a shaft to the rotation arms for rotating the swinger housing;
   gripper means coupled to the swinger housing for grasping and holding the cassette while the swinger housing is rotated to lift and transport the cassette;
   depressor means coupled to the swinger housing for pushing and retaining the wafers within the cassette while the cassette is lifted and transported;
   first sensor means coupled to the gripper means for sensing whether the cassette has been gripped by the gripper means;
   second sensor means coupled to the depressor means for sensing the position of the depressor means; and third sensor means coupled to at least one of the rotation arms for sensing the position of the swinger housing.

2. An automated cassette handler for transporting integrated circuit wafers held in a wafer cassette within a canopy, said canopy coupled to a piece of integrated circuit processing equipment, said handler comprising:

housing means within said canopy for housing the cassette;

moving means coupled to said canopy and said housing for moving said housing;

gripper means coupled to said housing means for grasping and holding the cassette while said housing means is moved by said moving means, the gripper means and the moving means together being operative to maintain the housing means in a substantially constant plane with respect to the canopy while the housing means is being moved; and depressor means pivotally mounted on an upper portion of and cantilevered from said housing means for pushing and retaining the wafers within the cassette while said housing means is moved.

3. The automated cassette handler of claim 2 wherein the depressor means comprises:

a pivotally mounted depressor arm;

a depressor bar coupled to a first end of the depressor arm for pressing against the wafers within the cassette; and a second actuator coupled to a second end of the depressor arm for pivoting the depressor arm.

4. The automated cassette handler of claim 2 comprising:

sensor means coupled to the depressor means for sensing the position of the depressor means.

5. The automated cassette handler of claim 2 comprising:

first sensor means coupled to the gripper means for sensing whether the cassette has been gripped by the gripper means; and second sensor means coupled to the depressor means for sensing the position of the depressor means.

* * * * *